(12) United States Patent
Suzumura et al.

(10) Patent No.: US 9,613,860 B2
(45) Date of Patent: Apr. 4, 2017

(54) METHOD OF MANUFACTURING THIN-FILM TRANSISTOR

(71) Applicant: Japan Display Inc., Minato-ku (JP)

(72) Inventors: Isao Suzumura, Tokyo (JP); Arichika Ishida, Tokyo (JP); Hidekazu Miyake, Tokyo (JP); Hiroto Miyake, Tokyo (JP); Yohei Yamaguchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/996,323

(22) Filed: Jan. 15, 2016

(65) Prior Publication Data

US 2016/0211177 A1 Jul. 21, 2016

(30) Foreign Application Priority Data

Jan. 19, 2015 (JP) .................. 2015-007527

(51) Int. Cl.
| | |
|---|---|
| *H01L 21/768* | (2006.01) |
| *H01L 29/66* | (2006.01) |
| *H01L 21/02* | (2006.01) |
| *H01L 29/417* | (2006.01) |
| *H01L 29/45* | (2006.01) |
| *H01L 29/786* | (2006.01) |
| *H01L 29/49* | (2006.01) |
| *H01L 21/78* | (2006.01) |

(52) U.S. Cl.
CPC ...... *H01L 21/76895* (2013.01); *H01L 21/022* (2013.01); *H01L 29/41733* (2013.01); *H01L 29/45* (2013.01); *H01L 29/66969* (2013.01); *H01L 29/7869* (2013.01); *H01L 21/78* (2013.01); *H01L 29/4908* (2013.01)

(58) Field of Classification Search
USPC ....................................... 257/59–72
See application file for complete search history.

(56) References Cited

U.S. PATENT DOCUMENTS

| | | | |
|---|---|---|---|
| 2010/0105162 A1 | 4/2010 | Suzawa et al. | |
| 2012/0217500 A1* | 8/2012 | Park ........................ | H01L 29/45 257/59 |
| 2012/0286267 A1 | 11/2012 | Suzawa et al. | |

FOREIGN PATENT DOCUMENTS

JP  2010-123936  6/2010

* cited by examiner

*Primary Examiner* — Thanh T Nguyen
(74) *Attorney, Agent, or Firm* — Oblon, McClelland, Maier & Neustadt, L.L.P.

(57) ABSTRACT

According to one embodiment, a method of manufacturing a thin-film transistor includes forming a semiconductor layer on a gate electrode with an insulating layer 12 being interposed, forming interconnect formation layers on the semiconductor layer, forming a plurality of interconnects and electrodes by patterning the interconnect formation layers through etching, patterning the semiconductor layer in an island shape through etching after forming the electrodes, exposing a channel region of the semiconductor layer by etching a part of the electrodes on the semiconductor layer, and forming a protective layer so as to overlap the interconnects, the electrodes and the semiconductor layer having the island shape.

4 Claims, 8 Drawing Sheets

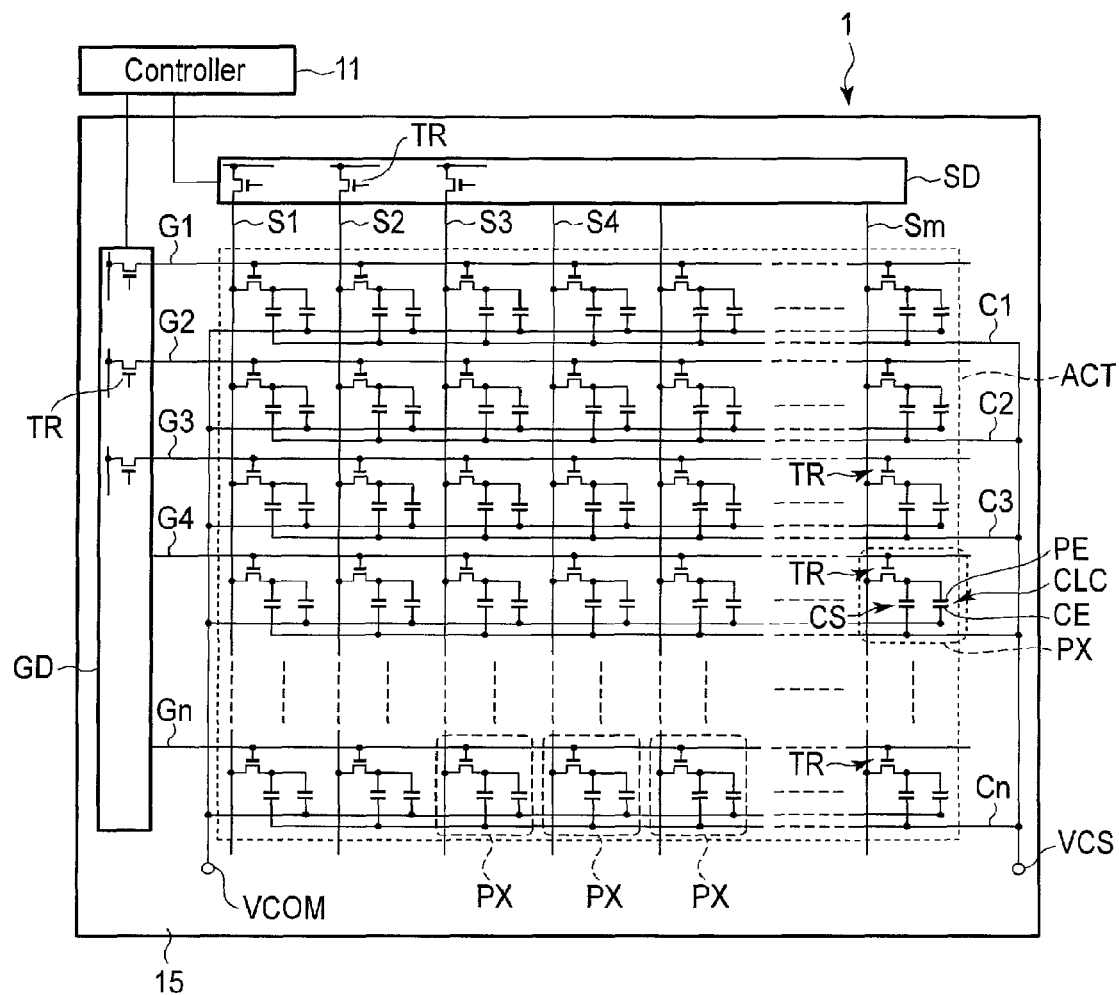
F I G. 1

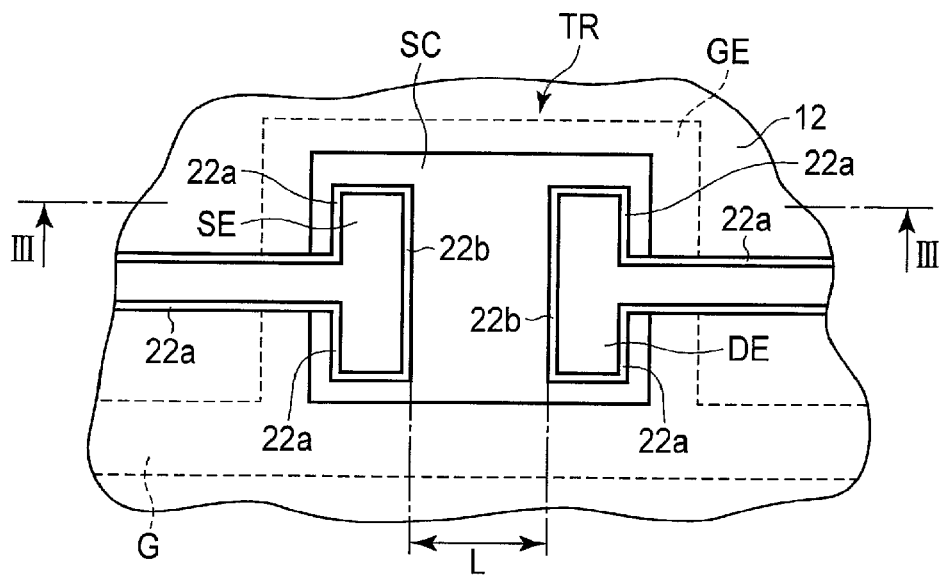
F I G. 2
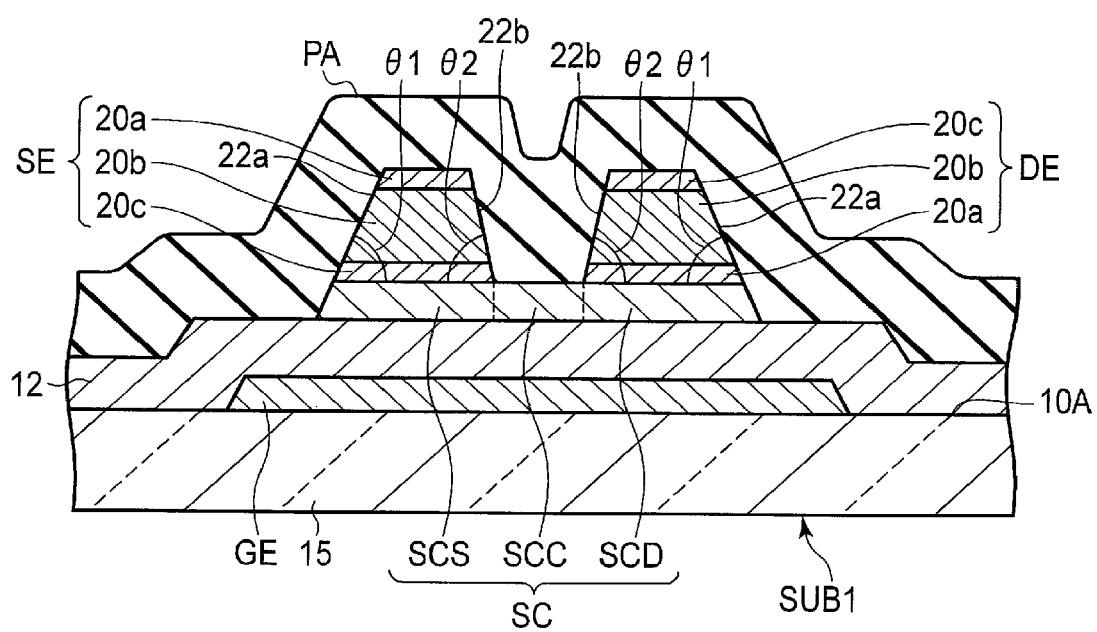
F I G. 3

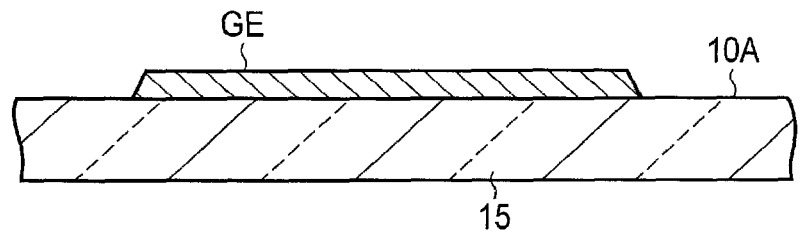
F I G. 4
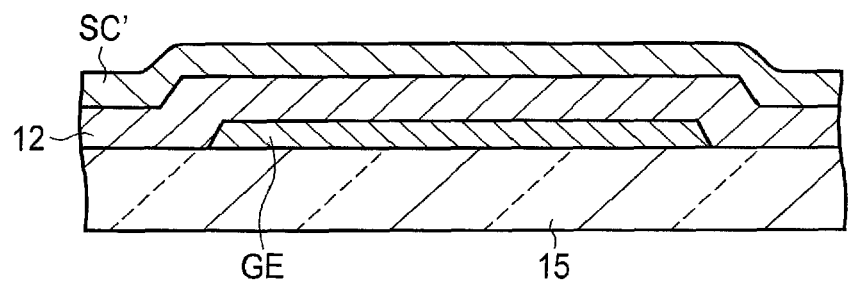
F I G. 5
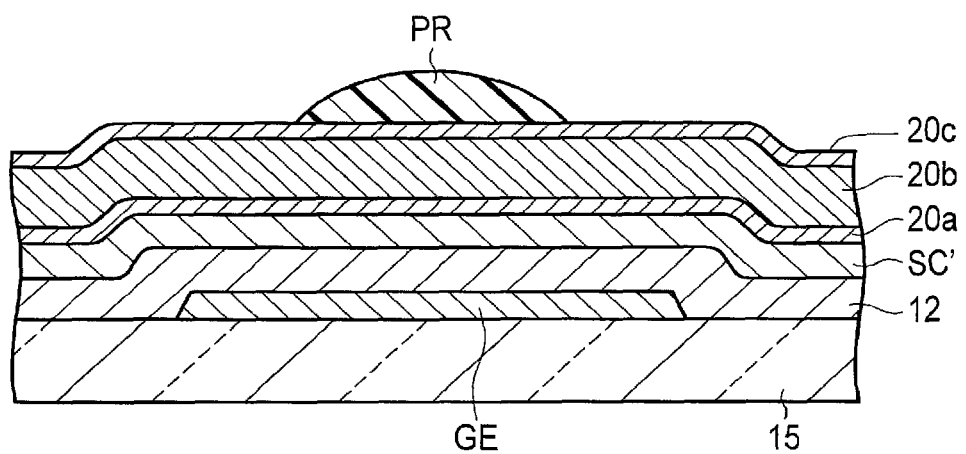
F I G. 6

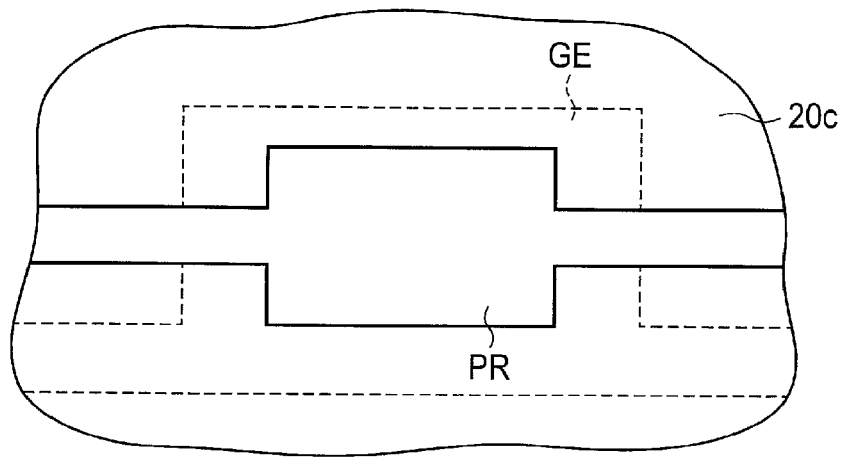
F I G. 7
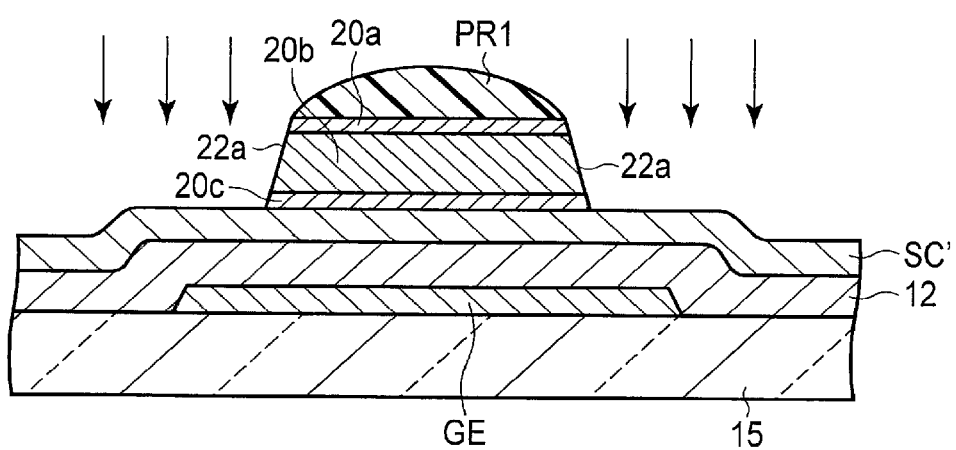
F I G. 8

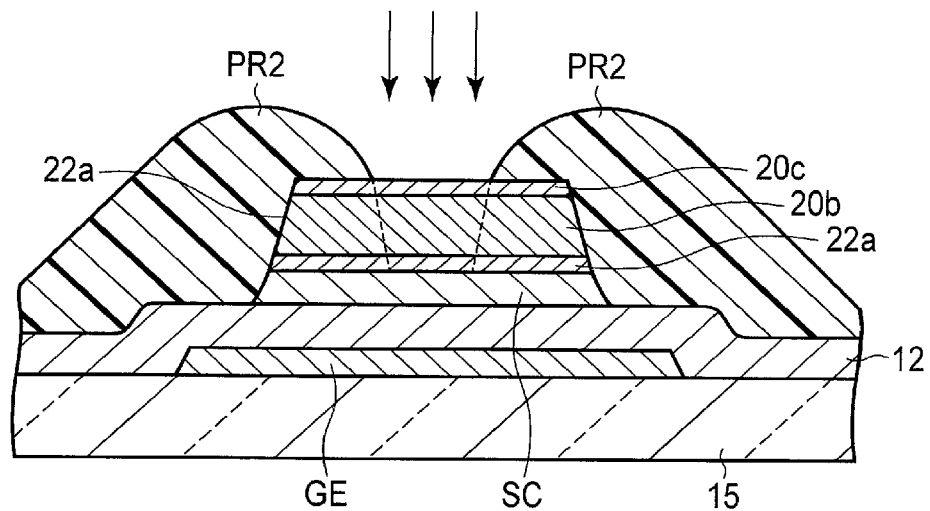
F I G. 11
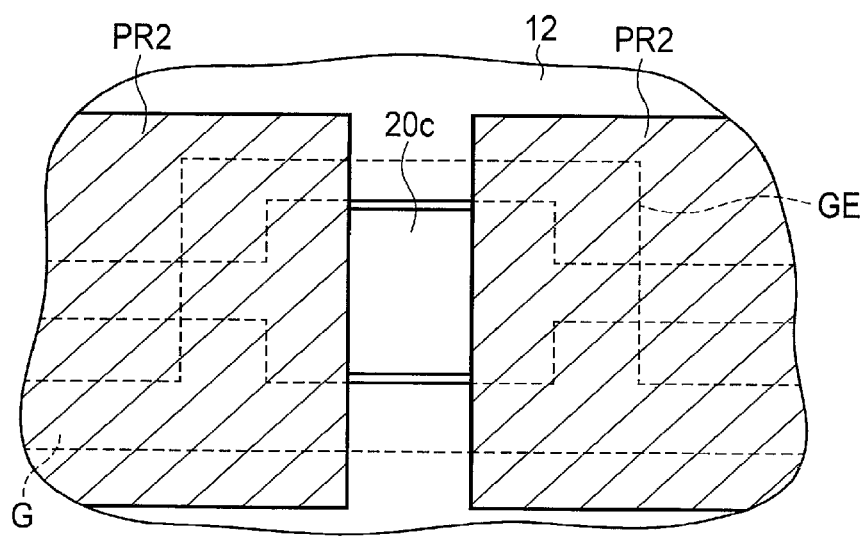
F I G. 12

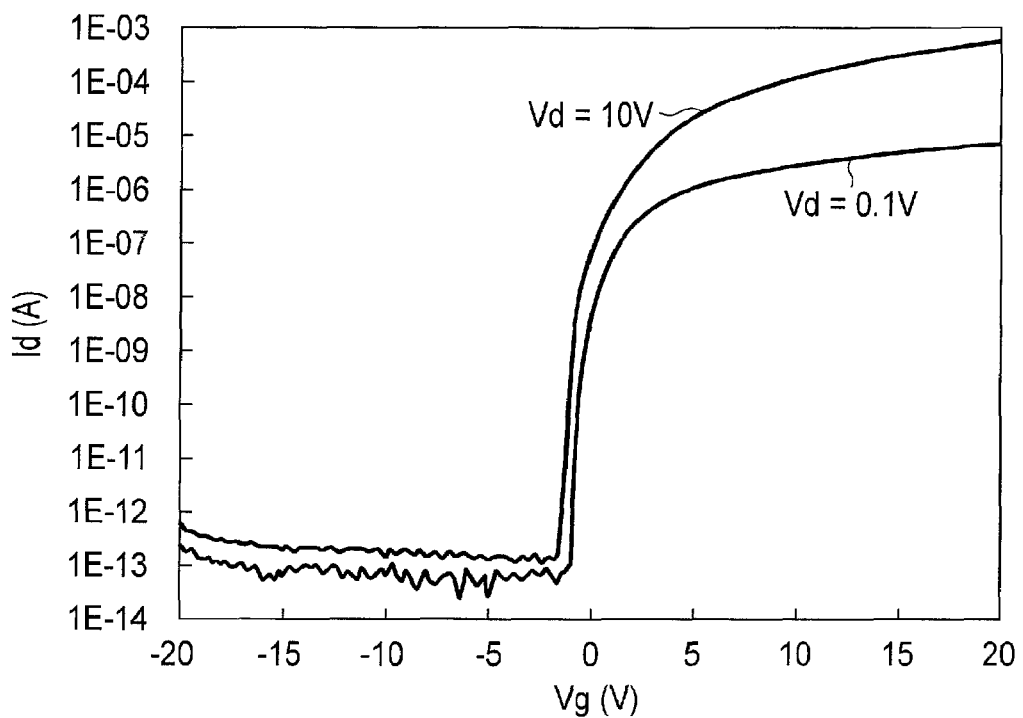
F I G. 15
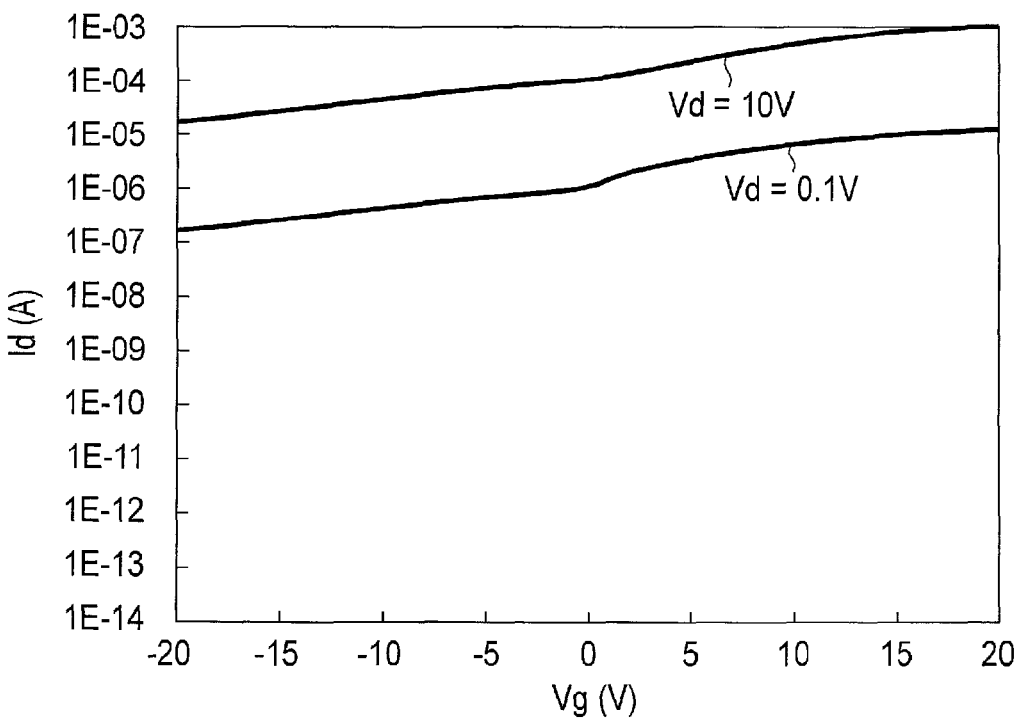
F I G. 16

METHOD OF MANUFACTURING THIN-FILM TRANSISTOR

CROSS-REFERENCE TO RELATED APPLICATIONS

This application is based upon and claims the benefit of priority from Japanese Patent Application No. 2015-007527, filed Jan. 19, 2015, the entire contents of which are incorporated herein by reference.

FIELD

Embodiments described herein relate generally to a method of manufacturing a thin-film transistor.

BACKGROUND

Recently, display devices comprising a thin-film transistor as a semiconductor device have been put into practical use. As examples of display devices, a liquid crystal display device and an organic electroluminescence display device are considered.

These types of display devices comprise an array substrate comprising, for example, a plurality of thin-film transistors (TFTs), signal lines, gate lines, an interconnect portion of source and drain electrodes, and a passivation film. The thin-film transistors and various interconnect portions are patterned in a predetermined shape by photolithography, dry etching, etc.

For example, in general, in a bottom-gate channel-etch TFT, a semiconductor layer is processed in an island shape. Subsequently, an interconnect layer is formed on the semiconductor layer. Further, the interconnect layer is etched to form signal lines and scanning lines. Subsequently, a passivation film is formed in order to cover the signal lines, the scanning lines and the semiconductor layer.

However, when a Ti-based/Al-based/Ti-based (TAT) laminated film is used as the interconnect layer and the signal line in order to obtain a high-definition display device, out of the sidewalls of the signal line formed by etching, the sidewall located in an end portion of the semiconductor layer and the sidewall located apart from the semiconductor layer easily have a large taper angle. When the taper angle of sidewalls is large, the taper angle of the portion which covers the sidewalls of the signal line is also large in the passivation film formed on the interconnect layer. Thus, a cavity (fine hole) is easily formed in the standing portion. In this case, the semiconductor layer of the TFT is reduced by water or hydrogen inserted from outside through the cavity (hole). As a result, the TFT easily becomes conductive.

BRIEF DESCRIPTION OF THE DRAWINGS

FIG. 1 schematically shows a structural example of a display device according to a first embodiment.

FIG. 2 is a plan view schematically showing a structural example of an array substrate which is applied to the display device shown in FIG. 1.

FIG. 3 is a cross-sectional view of the array substrate along line of FIG. 2.

FIG. 4 is a cross-sectional view showing a step for manufacturing the array substrate.

FIG. 5 is a cross-sectional view showing a step for manufacturing the array substrate.

FIG. 6 is a cross-sectional view showing a state where a photoresist is formed on a multilayer metal layer in a process for manufacturing the array substrate.

FIG. 7 is a plan view showing the state where the photoresist is formed on the multilayer metal layer in the process for manufacturing the array substrate.

FIG. 8 is a cross-sectional view showing a step for etching the multilayer metal layer in the process for manufacturing the array substrate.

FIG. 11 is a cross-sectional view showing a state where a photoresist is formed on an electrode, the semiconductor layer and a gate insulating layer in the manufacturing process.

FIG. 12 is a plan view showing the state where the photoresist is formed on the electrode, the semiconductor layer and the gate insulating layer in the manufacturing process.

FIG. 15 shows the relationship between the coverage property (good) of a passivation film and the characteristics of a thin-film transistor.

FIG. 16 shows the relationship between the coverage property (poor) of a passivation film and the characteristics of a thin-film transistor.

DETAILED DESCRIPTION

Figure 9:
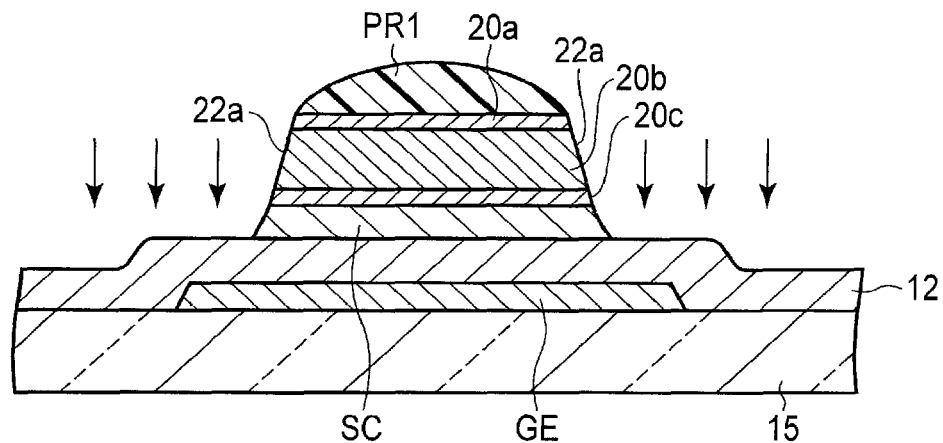
FIG. 9 is a cross-sectional view showing a step for etching a semiconductor layer in the process for manufacturing the array substrate.

Various embodiments will be described hereinafter with reference to the accompanying drawings. In general, according to one embodiment, a method of manufacturing a thin-film transistor comprises: forming a semiconductor layer on a gate electrode with an insulating layer being interposed; forming an interconnect formation layer on the semiconductor layer; forming a plurality of interconnects and electrodes by patterning the interconnect formation layer through etching; patterning the semiconductor layer in an island shape through etching after forming the electrodes; exposing a channel region of the semiconductor layer by etching a part of the electrodes on the semiconductor layer; and forming a protective layer so as to overlap the interconnects, the electrodes and the semiconductor layer having the island shape.

The disclosure is merely an example. Proper changes which maintain the spirit of the invention and are easily conceivable by a person of ordinary skill in the art are included in the scope of the present invention as a matter of course. To further clarify the explanation, drawings may exemplarily show the width, thickness, shape, etc., of each portion in comparison with the actual aspect. However, the drawings are merely examples and do not restrict the interpretation of the present invention. In the specification and drawings of this application, elements similar to those in the already described drawings may be denoted by the same reference numbers, and their detailed descriptions may be arbitrarily omitted.

First Embodiment

First, this specification explains a structural example of a display device comprising a thin-film transistor.

FIG. 1 schematically shows a structural example of a display device according to a first embodiment. Here, a liquid crystal display device is explained as an example of a display device comprising an array substrate. The liquid crystal display device 1 can be used when it is incorporated into various types of electronic devices such as a smartphone, a tablet terminal, a mobile phone, a notebook computer, a portable game console, an electronic dictionary or a television.

As shown in FIG. 1, the liquid crystal display device 1 comprises an insulating substrate 15 having a light transmitting property such as a glass substrate, a display portion (active area) ACT which is provided on the insulating substrate 15 and displays an image, and driving circuits GD and SD which drive the display portion ACT. The display portion ACT comprises a plurality of display pixels PX arrayed in a matrix.

For example, gate lines G (G1 to Gn), capacitance lines C (C1 to Cn), source lines S (S1 to Sm) and a power supply line VCS are formed in the display portion ACT. Each gate line G is extended to the outside of the active area ACT and is connected to the gate driving circuit GD. Each source line S is extended to the outside of the display portion ACT and is connected to the source driving circuit SD. Each capacitance line C is electrically connected to the power supply line VCS to which a storage capacitance voltage is applied.

The driving circuits GD and SD are formed integrally on the insulating substrate 15 outside the display portion ACT. A controller 11 is connected to the driving circuits GD and SD.

Each display pixel PX comprises liquid crystal capacitance CLC, a thin-film transistor (TFT) TR, storage capacitance CS in parallel with the liquid crystal capacitance CLC, etc. The liquid crystal capacitance CLC comprises a pixel electrode PE connected to the thin-film transistor TR, a common electrode CE which is electrically connected to a power supply portion VCOM having a common potential, and a liquid crystal layer interposed between the pixel electrode PE and the common electrode CE.

The thin-film transistor TR is electrically connected to the gate line G and the source line S. A control signal to control the thin-film transistor TR so as to be in an on-state or an off-state is supplied from the gate driving circuit GD to the gate line G. A video signal is supplied from the source driving circuit SD to the source line S. The thin-film transistor TR writes a pixel potential to the pixel electrode PE in accordance with the video signal supplied to the source line S when the thin-film transistor TR is in an on-state based on the control signal supplied to the gate line G. The voltage applied to the liquid crystal layer is controlled by the difference in potential between the common electrode CE having a common potential and the pixel electrode PE having a pixel potential.

The storage capacitance CS holds the voltage applied to the liquid crystal layer for a certain period and includes a pair of electrodes facing each other via an insulating layer. For example, the storage capacitance CS includes a first electrode having the same potential as the pixel electrode PE, a second electrode which is electrically connected to a part of the capacitance line C or the capacitance line C, and an insulating layer interposed between the first electrode and the second electrode.

The gate driving circuit GD and the source driving circuit SD comprise a plurality of thin-film transistors (TFTs) TR each of which functions as a switching element.

FIG. 2 is a plan view schematically showing a structural example of an array substrate applicable to the liquid crystal display device 1 shown in FIG. 1. FIG. 3 is a cross-sectional view of the array substrate along line of FIG. 2.

The array substrate SUB1 is formed by using the insulating substrate 15 having a light transmitting property such as a glass substrate or a resin substrate. On the insulating substrate 15, the array substrate SUB1 comprises the thin-film transistor TR, the storage capacitance CS, the gate line G, the source line S and the pixel electrode included in each display pixel PX, and the plurality of thin-film transistors TR included in the gate driving circuit GD and the source driving circuit SD. Here, the thin-film transistor TR which functions as a semiconductor device is looked at and explained in detail.

In the structural examples shown in FIG. 2 and FIG. 3, the thin-film transistor TR is structured as a bottom-gate channel-etch transistor. A gate electrode GE is formed on an inner surface 10A of the insulating substrate 15. The gate electrode GE included in the thin-film transistor TR is formed of a metal material such as copper (Cu), aluminum (Al), titanium (Ti), molybdenum (Mo), tungsten (W), tantalum (Ta) or chromium (Cr), or alloy containing these metal materials. The gate electrode GE is electrically connected to the gate line G provided in the same layer as the gate electrode GE or the control line of the driving circuit. The gate electrode GE is patterned in, for example, a rectangular shape.

A gate insulating layer 12 is formed in order to cover the gate electrode GE and the inner surface 10A of the insulating substrate 15. The gate insulating layer 12 includes, for example, a silicon oxide layer containing a silicon oxide ($SiO_x$) as the main component. In the present embodiment, the gate insulating layer 12 is formed by a silicon oxide layer as a whole. The gate insulating layer 12 may be composed of a laminated film including a silicon oxide layer containing a silicon oxide ($SiO_x$) as the main component and a different insulating layer containing, for example, a silicon nitride ($SiN_x$). When the gate insulating layer 12 is formed by a laminated film, the gate insulating layer 12 is preferably formed such that a silicon oxide layer is in contact with a semiconductor layer. In the present embodiment, a layer is used as a concept encompassing a membrane or a film.

For example, an oxide semiconductor layer SC is formed on the gate insulating layer 12 as the semiconductor layer included in the thin-film transistor TR. The oxide semiconductor layer SC is provided in order to at least partially overlap the gate electrode GE. In the present embodiment, the whole semiconductor layer SC is superimposed on the gate electrode GE.

The oxide semiconductor layer SC is formed of an oxide containing at least one of indium (In), gallium (Ga), zinc (Zn) and tin (Sn). Typical examples of materials forming the oxide semiconductor layer SC are indium-gallium-zinc oxide (InGaZnO), indium gallium oxide (InGaO), indium zinc oxide (InZnO), zinc tin oxide (ZnSnO), zinc oxide (ZnO), etc.

The oxide semiconductor layer SC is patterned in, for example, a substantially rectangular island shape. The oxide semiconductor layer SC comprises a channel region SCC in which the resistance is relatively high, and a source region SCS and a drain region SCD on both sides of the channel region SCC. The channel region SCC has a channel length L. A pixel electrode (not shown) is formed on the gate insulating layer 12 in a manner similar to that of the oxide semiconductor layer SC.

The thin-film transistor TR comprises a source electrode SE and a drain electrode DE. The source electrode SE and the drain electrode DE are provided such that they are in contact with at least a part of the oxide semiconductor layer SC. The source electrode SE is formed over the gate insulating layer 12 and is partially superimposed on the source region of the oxide semiconductor layer SC. The source electrode SE is electrically connected to the source line S formed on the gate insulating layer 12. Here, the source electrode SE is formed in the same layer as the source line S.

The drain electrode DE is formed over the gate insulating layer 12 and is partially superimposed on the drain region SCD of the oxide semiconductor layer SC. The drain electrode DE faces the source electrode SE on the oxide semiconductor layer SC such that the drain electrode DE is apart from the source electrode SE by a distance equivalent to the channel length L. The drain electrode DE is electrically connected to the pixel electrode.

The source electrode SE, the drain electrode DE and the source line S are composed of a metal multilayer film. In the present embodiment, each of the source electrode SE, the drain electrode DE and the source line S has a laminated structure (Ti-based/Al-based/Ti-based) including a lower layer (a first layer) 20a formed of a metal material containing Ti as the main component such as Ti or TiN, an intermediate layer (a second layer) 20b formed of a metal material containing Al as the main component such as Al, AlSi, AlNd or AlCu, and an upper layer (a third layer) 20c formed of a metal material containing Ti as the main component. The intermediate layer 20b is formed so as to be sufficiently thick in comparison with the lower layer 20a and the upper layer 20c. The source electrode SE and the drain electrode DE are formed such that the lower layer 20a side is in contact with the oxide semiconductor layer SC. The source line S is provided such that the lower layer 20a side is in contact with the gate insulating layer 12.

As shown in FIG. 2 and FIG. 3, each of the source electrode SE and the drain electrode DE comprises sidewalls which stand relative to the gate insulating layer 12 and the oxide semiconductor layer SC. Out of the sidewalls, a sidewall 22a located on the gate insulating layer 12, and a sidewall 22b located near the gate insulating layer 12 on the semiconductor layer SC are formed at taper angle θ1 (for example, 45 to 75°). Out of the sidewalls, the sidewall 22b located on the central portion side of the semiconductor layer SC apart from the gate insulating layer 12, that is, the sidewall 22b located along the side edge of the channel region of the semiconductor layer SC, is formed at taper angle 92 (for example, 45 to 75°). The sidewall 22b of the source electrode SE faces the sidewall 22b of the drain electrode DE with the channel region being interposed. Taper angles θ1 and θ2 are substantially equal to each other.

A passivation film (protective film) PA is formed over the array substrate SUB1 and covers the source line S, the source electrode SE, the drain electrode DE and the oxide semiconductor layer SC as a whole. The passivation film PA may be formed by a chemical vapor deposition (CVD) method using an inorganic film, an olefin resin, an acrylate resin, a siloxane resin, etc. The film thickness of the passivation film PA is preferably greater than that of the metal multilayer film (Ti-based/Al-based/Ti-based) of the source electrode SE, the drain electrode DE and the source line S.

In FIG. 2, the passivation film PA is omitted to simplify the figure.

Now, this specification explains an example of a method of manufacturing the thin-film transistor TR applied to the display device of the present embodiment.

As shown in FIG. 4, for example, a gate layer is formed on the inner surface 10A of the insulating substrate 15 by sputtering. The gate line G and the gate electrode GE are formed by patterning the gate layer. Here, a transparent glass substrate is used as the insulating substrate 15. For the gate layer, for example, an Mo-based material is used.

Subsequently, as shown in FIG. 5, the gate insulating layer 12 is formed on the inner surface 10A of the insulating substrate 15 such that the gate insulating layer 12 overlaps the gate electrode GE. For example, the gate insulating layer 12 is formed through a plasma CVD method. The gate insulating layer 12 is formed of a silicon oxide (SiOx). Subsequently, for example, a semiconductor layer SC' is formed on the gate insulating layer 12 by sputtering. The semiconductor layer SC' is formed of indium-gallium-zinc oxide (InGaZnO).

As shown in FIG. 6, a metal film is sequentially formed on the semiconductor layer SC' by sputtering, etc. For the metal film, for example, a metal multilayer film (interconnect formation layer) including the Ti-based lower layer 20a, the Al-based intermediate layer 20b and the Ti-based upper layer 20c is used. Subsequently, the formed metal multilayer film is patterned to form the source electrode SE, the drain electrode DE and the source line S.

In this case, as shown in FIG. 6 and FIG. 7, a photoresist PR1 having a desired pattern is formed on the metal multilayer film. The photoresist PR1 is formed by, for example, applying patterning through a photolithography process with exposure and development via a photolithographic mask after applying a photosensitive insulating material such as an olefin resin to the metal multilayer film. The photoresist PR1 has a pattern which is located immediately over the formation region of the source electrode SE, the drain electrode DE, the source line S and the oxide semiconductor layer SC.

Subsequently, as shown in FIG. 8, the metal multilayer film is patterned collectively, using the photoresist PR1 as a mask. For this patterning, for example, reactive ion etching (RIE), which is one type of plasma dry etching, is used. As the etching gas, a gaseous mixture of boron trichloride ($BCl_3$) and chlorine ($Cl_2$) is used. Further, nitrogen ($N_2$) may be mixed. In this manner, the outline of the source electrode SE, the drain electrode DE and the source line S is formed. Taper angle θ1 of the formed sidewall 22a is, for example, 45 to 75°. At the time of etching, the gate insulating layer 12 is covered by the semiconductor layer SC' and is not exposed near the sidewall 22a. Therefore, the formation material of the gate insulating layer 12 is not redeposited on the sidewall 22a through etching. Thus, taper angle θ1 of the sidewall 22a can be made small.

Figure 10:
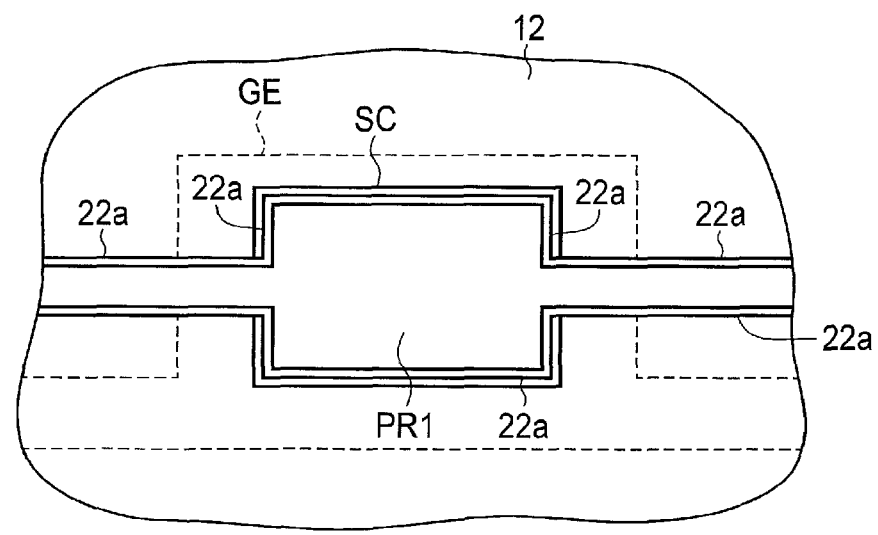
FIG. 10 is a plan view showing the step for etching the semiconductor layer in the process for manufacturing the array substrate.

Subsequently, as shown in FIG. 9 and FIG. 10, the semiconductor layer SC' is patterned collectively, using the photoresist PR1 as a mask. For this patterning, in a manner similar to that of the above, for example, reactive ion etching (RIE) or wet etching is used. The semiconductor layer SC' is patterned in an island shape by etching. In this manner, a plurality of oxide semiconductor layers SC are formed. As the etching gas, the mixture of additive gasses such as boron trichloride ($BCl_3$) and chlorine ($Cl_2$) is used. As the additive gas, for example, trifluoromethane ($CHF_3$) is preferable. Nitrogen ($N_2$) may be added to the gaseous mixture.

Through the two-staged etching, the source electrode SE, the drain electrode DE and the source line S defined by the sidewall 22a having taper angle θ1, and the oxide semiconductor layer SC having a substantially rectangular shape are formed in series. After completion of etching, the photoresist PR1 is eliminated.

Subsequently, as shown in FIG. 11 and FIG. 12, a photoresist PR2 having a desired pattern is formed on the source electrode SE, the drain electrode DE, the source line S, the oxide semiconductor layer SC having a substantially rectangular shape, and the gate insulating layer 12. The photoresist PR2 has a pattern in which a portion above the channel region of the oxide semiconductor layer SC is exposed. The photoresist PR2 covers the sidewall 22a and the gate insulating layer 12 around the sidewall 22a in order to prevent increase in taper angle 91 of the sidewall 22a of the source electrode SE, the drain electrode DE and the source line S during etching.

The metal multilayer film located on the channel region is patterned collectively, using the photoresist PR2 as a mask. For this patterning, for example, reactive ion etching (RIE), which is one type of plasma dry etching, is used. Through etching, the metal multilayer film is fully etched up to the oxide semiconductor layer SC.

Figure 13:
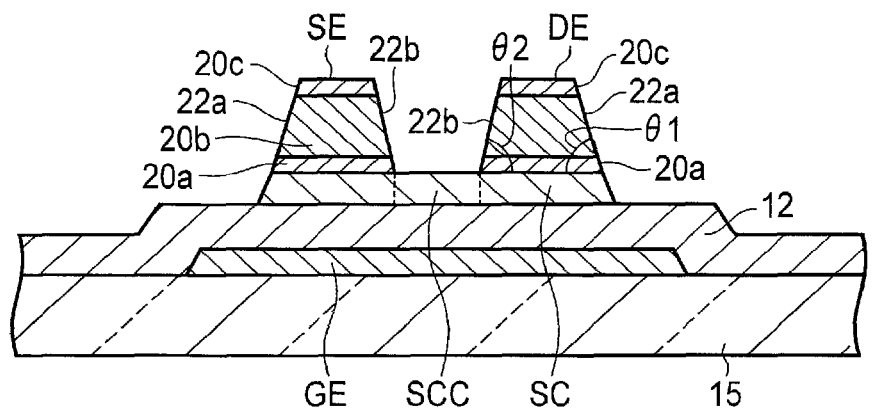
FIG. 13 is a cross-sectional view of the array substrate showing a state where the electrode is etched in the manufacturing process.
Figure 14:
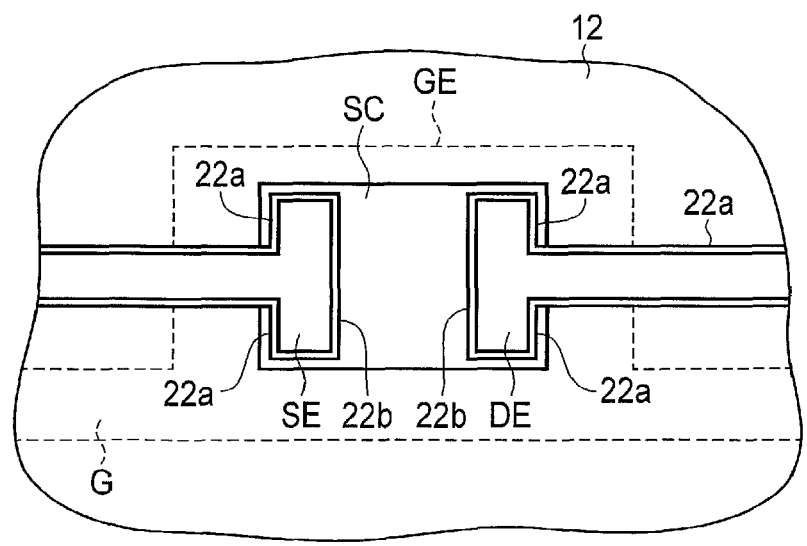
FIG. 14 is a plan view of the array substrate showing the state where the electrode is etched in the manufacturing process.

In this manner, as shown in FIG. 13 and FIG. 14, the metal multilayer film on the channel region is etched. Thus, the sidewalls 22b of the source electrode SE and the drain electrode DE are formed. Taper angle θ2 of the sidewalls 22b is 45 to 75°. At the time of etching, only the oxide semiconductor layer SC is exposed as the base. Therefore, taper angle θ2 of the sidewalls 22b can be easily made small and be made nearly equal to taper angle θ1 of the sidewalls 22a. After completion of etching, the photoresist PR2 is eliminated.

Subsequently, the passivation film (protective layer) PA is formed on the insulating substrate 15. The whole array substrate including the source line S, the source electrode SE, the drain electrode DE, the oxide semiconductor layer SC, etc., is covered by the passivation film. For the passivation film PA, for example, an inorganic film, an olefin resin, an acrylate resin or a siloxane resin is used. The film thickness of the passivation film PA is preferably greater than that of the metal multilayer film (Ti-based/Al-based/Ti-based) of the source electrode SE, the drain electrode DE and the source line S.

By the above steps, the array substrate SUB1 comprising the thin-film transistor TR is manufactured.

According to the display device and the thin-film transistor having the above structures, and the method of manufacturing the thin-film transistor, taper angles θ1 and θ2 of the sidewalls 22a and 22b of the electrodes and the interconnects can be made small in a range of 45 to 75°. In this case, in the passivation film covering the electrodes, the interconnects and the semiconductor layer, the taper angle of the portion covering the sidewalls of the interconnects and the electrodes can be also made small. Thus, the passivation film PA can adhere tightly to the interconnects, the electrodes and the gate insulating layer and assuredly cover the whole array substrate. At the same time, the formation of a cavity is prevented. The coverage property of the passivation film PA is improved. Thus, it is possible to inhibit the incursion of water, hydrogen, etc., from outside. Thus, it is possible to prevent reduction of the semiconductor layer of the thin-film transistor and the imparting of conductivity to the semiconductor layer.

If the taper angle of the sidewalls of the interconnects and the electrodes is less than 45°, the CD loss of the line width is large. Therefore, the taper angle is preferably in a range of 45 to 75°.

FIG. 15 and FIG. 16 show the relationship between the coverage property of the passivation film and the characteristics of the thin-film transistor TR. The channel width W and the channel length L of the thin-film transistor TR are 80 μm and 3 μm, respectively. FIG. 15 shows that the thin-film transistor TR is capable of supplying a desired drain current Id with gate voltage Vg (V) greater than a threshold when the coverage property is good as with the present embodiment. The thin-film transistor of the present embodiment is capable of obtaining a good TFT property.

In comparison with the present embodiment, FIG. 16 shows that the drain current Id always flows regardless of the gate voltage Vg in the thin-film transistor TR when the coverage property is poor. The reason is considered as follows: the semiconductor layer of the thin-film transistor is reduced and becomes conductive because of the poor coverage property.

As described above, according to the present embodiment, it is possible to obtain a thin-film transistor having a high coverage property and an improved reliability, and a method of manufacturing the thin-film transistor.

In the above embodiments, a liquid crystal display device is shown as a disclosure example of a display device including a thin-film transistor. As other application examples, various types of flat-panel display devices can be considered. For example, an organic electroluminescent (EL) display device, other auto-luminous light-emitting display devices and an electronic paper display device comprising an electrophoretic element may be considered. Regarding the display device to which the thin-film transistor is applied, it goes without saying that a structure or manufacturing process similar to that of the above-described embodiments can be applied to small, medium-sized and large display devices without particular limitation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

All of the structures and manufacturing processes which can be implemented by a person of ordinary skill in the art through arbitrary design changes based on the structures and manufacturing processes described above as the embodiments of the present invention are included in the scope of the present invention as long as they encompass the spirit of the present invention. In addition, other effects which can be obtained by the above embodiments and are self-explanatory from the description of this specification or can be arbitrarily conceived by a person of ordinary skill in the art are considered to be achieved by the present invention as a matter of course.

What is claimed is:

1. A method of manufacturing a thin-film transistor, the method comprising:
    forming a semiconductor layer above a gate electrode with an insulating layer being interposed;
    forming an interconnect formation layer on the semiconductor layer;
    forming a first resist on the interconnect formation layer and forming a plurality of interconnects and a part of each of electrodes by patterning the interconnect formation layer through etching in a state that the first resist covers the interconnect formation layer;

patterning the semiconductor layer in an island shape through etching after forming the electrodes;

removing the first resist after patterning the semiconductor layer;

forming a second resist on the interconnects, a part of the sidewall of the electrodes, and the insulating layer, and exposing a channel region of the semiconductor layer by etching a part of the electrodes on the semiconductor layer in a state that the second resist covers the interconnects, a part of the sidewall of the electrodes, and the insulating layer;

removing the second resist after exposing the channel region of the semiconductor layer; and forming a protective layer so as to overlap the interconnects, the electrodes and the semiconductor layer having the island shape.

2. The method of claim 1, wherein the interconnect formation layer is formed by stacking a plurality of metal layers.

3. The method of claim 2, wherein the semiconductor layer is formed of an oxide containing at least one of indium (In), gallium (Ga) and zinc (Zn).

4. The method of claim 3, wherein a sidewall of the interconnects and a sidewall of the electrodes are formed so as to have a taper angle of 45 to 75°.

* * * * *